United States Patent
Chang

(10) Patent No.: US 9,900,019 B1
(45) Date of Patent: Feb. 20, 2018

(54) CALIBRATION CIRCUIT AND CALIBRATION METHOD FOR TIME-INTERLEAVED ANALOG-TO-DIGITAL CONVERTER

(71) Applicant: Realtek Semiconductor Corporation, Hsinchu (TW)

(72) Inventor: Yuan-Shuo Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/719,523

(22) Filed: Sep. 28, 2017

(30) Foreign Application Priority Data

Jan. 10, 2017 (TW) .............................. 106100750 A

(51) Int. Cl.
H03M 1/10 (2006.01)

(52) U.S. Cl.
CPC ................................ H03M 1/1009 (2013.01)

(58) Field of Classification Search
CPC .. H03M 1/1009; H03M 1/121; H03M 1/1215; H03M 1/1085; H03M 1/0626
USPC .......................................... 341/118, 120, 155
See application file for complete search history.

(56) References Cited

U.S. PATENT DOCUMENTS 7,482,956 B2    1/2009  Huang et al.
8,482,445 B1 *  7/2013  Harris ................. H03M 1/1038
                                                            341/118
8,860,591 B2 * 10/2014  Nozaki ................... H03M 1/12
                                                            341/118
9,178,525 B2   11/2015  Ramakrishnan et al.

FOREIGN PATENT DOCUMENTS

CN              102904574 B     1/2016

OTHER PUBLICATIONS

Shafiq M. Jamal et al., "Calibration of Sample-Time Error in a Two-Channel Time-Interleaved Analog-to-Digital converter", IEEE transactions on circuits and systems—I: Regular Paper, vol. 51, No. 1, Jan. 2004.
Naoki Kurosawa et al., "Explicit Analysis of Channel Mismatch Effects in Time-Interleaved ADC Systems", IEEE Transactions on circuits and systems—I: Fundamental Theory and Applications, vol. 48, No. 3, Mar. 2001.

* cited by examiner

Primary Examiner — Khai M Nguyen
(74) Attorney, Agent, or Firm — CKC & Partners Co., Ltd.

(57) ABSTRACT

A calibration circuit for a time-interleaved analog-to-digital converter includes a filter circuit and a calculating circuit. The filter circuit is configured to receive a first signal and generate a second signal based on the first signal. The first signal comprises an image of an interference signal, the second signal comprises a reconstructed image of the interference signal, and a frequency of the reconstructed image of the interference signal is the same as a frequency of the image of the interference signal. The calculating circuit is configured to cancel the image of the interference signal of the first signal according to the second signal.

20 Claims, 9 Drawing Sheets

CALIBRATION CIRCUIT AND CALIBRATION METHOD FOR TIME-INTERLEAVED ANALOG-TO-DIGITAL CONVERTER

RELATED APPLICATIONS

This application claims priority to Taiwan Application Serial Number 106100750, filed Jan. 10, 2017, which is herein incorporated by reference.

BACKGROUND

Technical Field

The present disclosure relates to a calibration technology. More particularly, the present disclosure relates to a calibration circuit and a calibration method for a time-interleaved analog-to-digital converter.

Description of Related Art

In application of high speed data sampling, a time-interleaved analog-to-digital converter (TI ADC) is a competitive technology. However, channels of the time-interleaved analog-to-digital converter may have mismatch (e.g., gain mismatch, offset mismatch, sample-time errors and bandwidth mismatch) due to fabrication variation, which further results in distortion of sampled data and worse performance of the time-interleaved analog-to-digital converter.

SUMMARY

An aspect of the present disclosure is a calibration circuit for a time-interleaved analog-to-digital converter. The calibration circuit includes a filter circuit and a calculating circuit. The filter circuit is configured to receive a first signal and generate a second signal based on the first signal. The first signal comprises an image of an interference signal, the second signal comprises a reconstructed image of the interference signal, and a frequency of the reconstructed image of the interference signal is the same as a frequency of the image of the interference signal. The calculating circuit is configured to cancel the image of the interference signal of the first signal according to the second signal.

Another aspect of the present disclosure is a calibration method for a time-interleaved analog-to-digital converter, and the calibration method includes the following steps: by a filter circuit, generating a reconstructed image of the interference signal of a second signal based on an interference signal of a first signal, in which the first signal includes an image of the interference signal, and a frequency of the reconstructed image of the interference signal is the same as a frequency of the image of the interference signal; and by a calculating circuit, canceling the image of the interference signal of the first signal according to the reconstructed image of the interference signal of the second signal.

In conclusion, the calibration circuit and the calibration method that can cancel the images of the interference signals are provided in the present disclosure. The calibration circuit and the calibration method provided in the present disclosure can effectively cancel the images of the interference signals resulted from channel mismatch of the time-interleaved analog-to-digital converter, and therefore distortion problem of the sampled data is resolved and performance of the time-interleaved analog-to-digital converter is improved.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
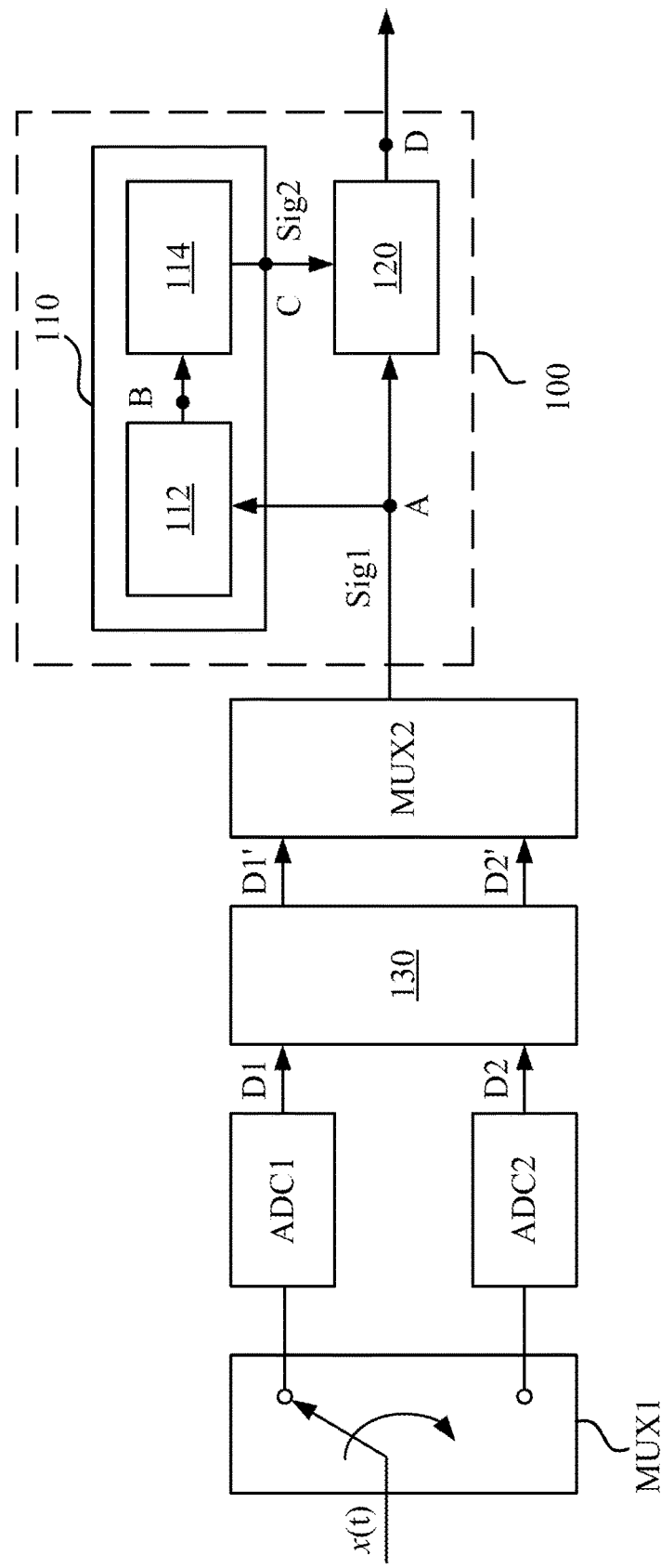
FIG. 1 is a schematic diagram of a calibration circuit according to an embodiment of the present disclosure.

Reference is made in detail to the present embodiments of the disclosure, examples of which are illustrated in the accompanying drawings. Wherever possible, the same reference numbers are used in the drawings and the description to refer to the same or like parts.

In the following description and claims, the terms "coupled" and "connected," along with their derivatives, may be used. In particular embodiments, "connected" and "coupled" may be used to indicate that two or more elements are in direct physical or electrical contact with each other, or may also mean that two or more elements may be in indirectly electrical contact with each other. The terms "coupled" and "connected" may still be used to indicate that two or more elements cooperate or interact with each other.

Reference is made to FIG. 1. FIG. 1 is a schematic diagram of a calibration circuit 100 according to an embodiment of the present disclosure. The calibration circuit 100 includes a filter circuit 110 and a calculating circuit 120. For convenience, a time-interleaved analog-to-digital converter (TI ADC) with two channels is described in the present embodiment. However, the present disclosure is not limited thereto.

As shown in FIG. 1, a signal x(t) with frequency fin is inputted to the time-interleaved analog-to-digital converter, and sampled data D1 and D2 are respectively generated through switching the signal x(t) (with the frequency fin) to analog-to-digital converters ADC1 and ADC2 by a multiplexer MUX1. It should be noted that if sampling frequencies of the analog-to-digital converters ADC1 and ADC2 are fs/2 (e.g., 80 MHz), a sampling frequency of the time-interleaved analog-to-digital converter is fs (e.g., 160 MHz).

In some embodiments, the signal x(t) can be called a test signal, and the test signal is configured to simulate an interference signal.

As aforementioned, because channel mismatch resulted from process variation may cause distortion of the sampled data D1 and D2. Therefore, a compensation circuit 130 can compensate the sampled data (e.g., offset compensation, gain compensation, sample-time compensation) to generate data D1' and D2', and the multiplexer MUX2 then generates a first signal Sig1 according to the data D1' and D2'. It should be noted that because non-ideal effects of the time-interleaved analog-to-digital converter include an image of an interference signal that is related to frequency, the first signal Sig1 compensated by the compensation circuit 130 may still have the image of the interference signal.

Figure 2A:
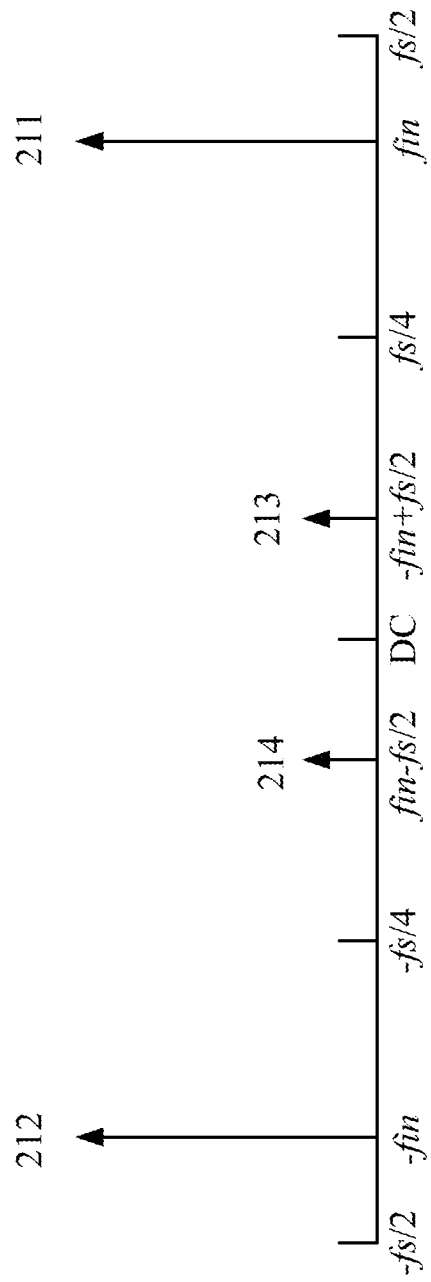
FIGS. 2A-2D are schematic diagrams of spectrums according to an embodiment of the present disclosure.
Figure 2B:
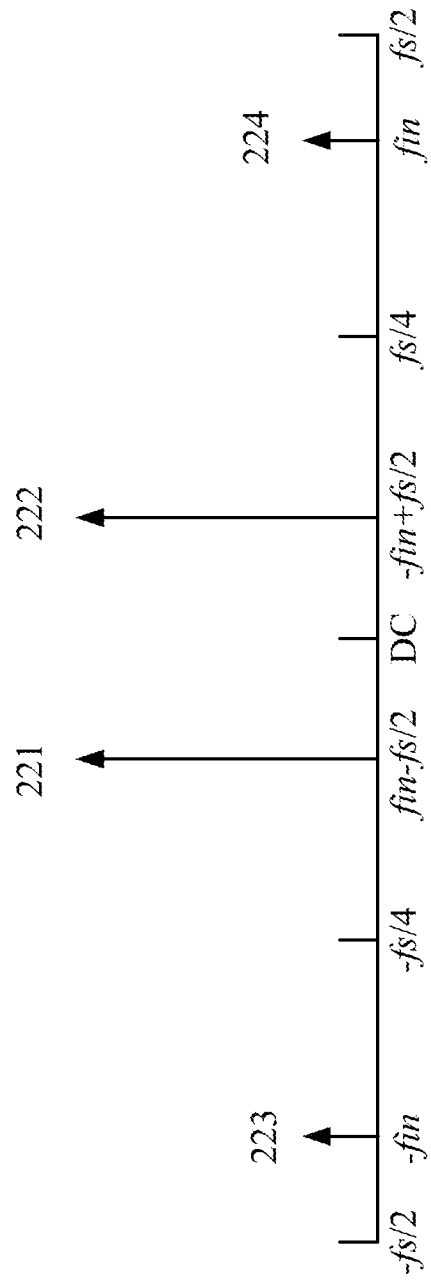
Figure 2C:
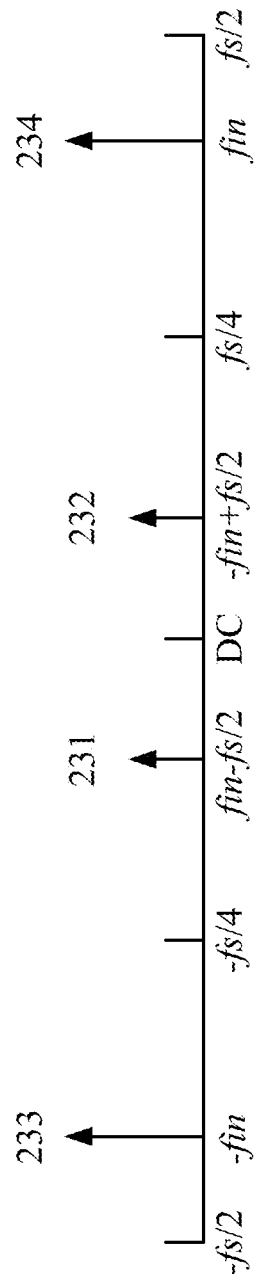

Reference is made to FIGS. 2A-2D. FIGS. 2A-2D are schematic diagrams of spectrums according to an embodiment of the present disclosure. A spectrum of the first signal Sig1 (i.e., at a node A) is shown in FIG. 2A. Interference signals 211 and 212 are respectively at frequencies fin and −fin, and the images 213 and 214 of the interference signals are at frequencies fin−fs/2 and −fin+fs/2, in which the frequencies fin−fs/2 and −fin+fs/2 are in an inner band between −fs/4 and fs/4. Therefore, the images 213 and 214 of the interference signals are difficult to be removed by a digital filter. The filter circuit 110 is configured to receive the first signal Sig1 and to generate a second signal Sig2 based on the first signal Sig1. As shown in FIG. 2C, the second signal Sig2 includes reconstructed images 231 and 232 of interference signals with frequencies at fin−fs/2 and −fin+fs/2 respectively.

In an embodiment, the filter circuit 110 includes a frequency shifter 112 and a signal reconstructing filter 114. The frequency shifter 112 is configured to shift frequencies (i.e., frequencies at fin and −fin) of the interference signals 211 and 212 to frequencies (i.e., frequencies at fin−fs/2 and −fin+fs/2) of the images 213 and 214 of the interference signals to generate shifted interference signals 221 and 222, as shown in FIG. 2B. In other words, the frequency shifter 112 shifts a frequency of the first signal Sig1 by fs/2 to generate a signal at node B.

Next, the signal reconstructing filter 114 is configured to generate the second signal Sig2 according to the images 213 and 214 of the interference signals and the shifted interference signals 221 and 222. Specifically, the signal reconstructing filter 114 of the filter circuit 110 is further configured to adjust amplitudes and phases of the shifted interference signals 221 and 222 to amplitudes and phases of the images 213 and 214 of interference signals, to generate the second signal Sig2 in FIG. 2C. In other words, the signal reconstructing filter 114 respectively adjust the shifted interference signals 221 and 222 and the shifted images 223 and 224 of interference signals at the node B (as shown in FIG. 2B) to the reconstructed images 231 and 232 of the interference signals and the reconstructed interference signals 233 and 234 at a node C (as shown in FIG. 2C). It should be noted that amplitudes and phases of the reconstructed images 231 and 232 of the interference signals at the node C are same as amplitudes and phases of the images 213 and 214 of the interference signals at node A.

Figure 2D:
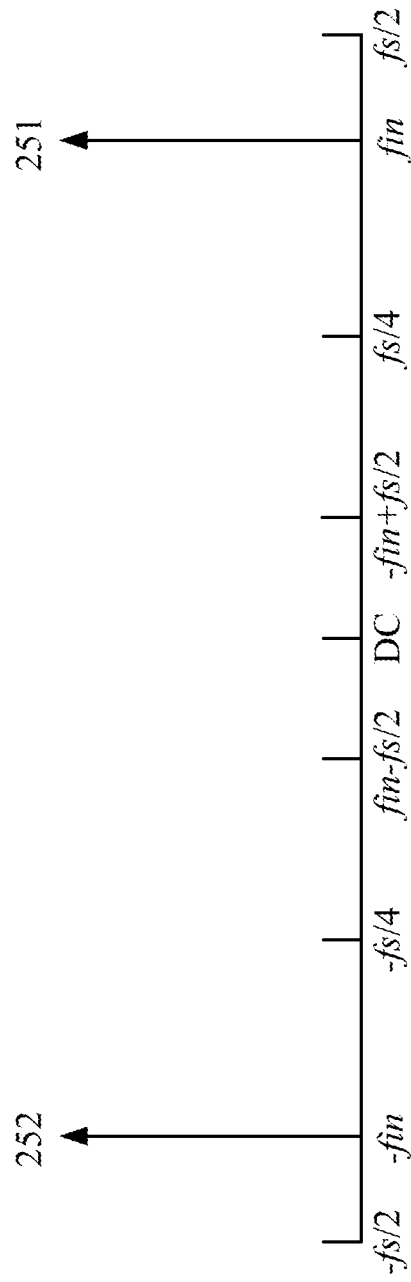

The calculating circuit 120 (e.g., a canceler) is configured to cancel the images 213 and 214 of the interference signals of the first signal Sig1 according to the reconstructed images 231 and 232 of the interference signals of the second signal Sig2. As shown in FIG. 2D, non-ideal effect of signal at a node D merely exist in calibrated interference signals 251 and 252 without any image of the interference signal. Because the calibrated interference signals 251 and 252 are out of the inner band between −fs/4 and fs/4, therefore the calibrated interference signals 251 and 252 can be removed by a filter (e.g., a digital filter).

As a result, the calibration circuit 100 of the present disclosure can remove the images 213 and 214 of the interference signals that are difficult to be compensated by the compensation circuit, and therefore improve distortion of the sampled data and further improve performance of the time-interleaved analog-to-digital converter.

In an embodiment, the signal reconstructed filter 114 is further configured to implement reconstruction by passing the shifted first signal through time-domain filter coefficients $\{a_0, a_1, a_2, a_3, \ldots, a_n\}$, to generate the second signal Sig2. Frequency shift and fast Fourier transform (FFT) are performed to test signals x1(t)-xn(t) to generate a plurality of first intermediate signals Xm1-Xmn respectively, and FFT is performed to the test signals x1(t)-xn(t) to generate second intermediate signals Ym1-Ymn. The filter coefficients $\{a_0, a_1, a_2, a_3, \ldots, a_n\}$ in time domain are generated through dividing the first intermediate signals Xm1-Xmn by the second intermediate signals Ym1-Ymn and performing inverse fast Fourier transform (IFFT). Specifically, for example of the test signal x1(t) with a single frequency of fin, frequencies of the interference signals 211 and 212 of the first signal Sig1 are shifted to frequencies (i.e., frequencies at fin−fs/2 and −fin+fs/2) of the images 213 and 214 of the interference signals to generate the shifted interference signals 221 and 222. Next, shifted interference signal Xm1 in frequency domain is generated by performing 1-point FFT on the shifted interference signals 221 and 222, and image Ym1 of interference signal in frequency domain is generated by performing 1-point FFT on the images 213 and 214 of the interference signals. A filter coefficient Hm1 in a frequency domain is generated through dividing the shifted interference signal Xm1 in frequency domain by the image of the interference signal Ym1 in frequency domain (i.e., Hm1=Ym1/Xm1). It should be noted that the filter coefficient Hm1 in the frequency domain corresponds to the signal x1(t) with the single frequency of fin. In order to generate the filter coefficients $\{a_0, a_1, a_2, a_3, \ldots, a_n\}$ in time domain, filter coefficients Hm1-Hmn in frequency domain are generated from the signals x1(t)-xn(t) with different frequencies at f1-fn by the aforementioned method, and then the filter coefficients $\{a_0, a_1, a_2, a_3, \ldots, a_n\}$ in time domain are generated from the filter coefficients Hm1-Hmn in frequency domain by performing IFFT.

As a result, the signal reconstructing filter 114 can generate the reconstructed images 231 and 232 of the interference signals of the second signal Sig2 based on the shifted interference signals 221 and 222, and generate the reconstructed interference signals 233 and 234 of the second signal Sig2 based on the shifted images 223 and 224 of the interference signals through the filter coefficients $\{a_0, a_1, a_2, a_3, \ldots, a_n\}$. Amplitude and phase of the reconstructed images 231 and 232 of the interference signals are same as amplitude and phase of the images 213 and 214 of the interference signals. Therefore, the calculating circuit 120 (e.g., a canceler) is further configured to subtract the second signal Sig2 from the first signal Sig1 to cancel the images 213 and 214 of the interference signals of the first signal Sig1.

Figure 3:
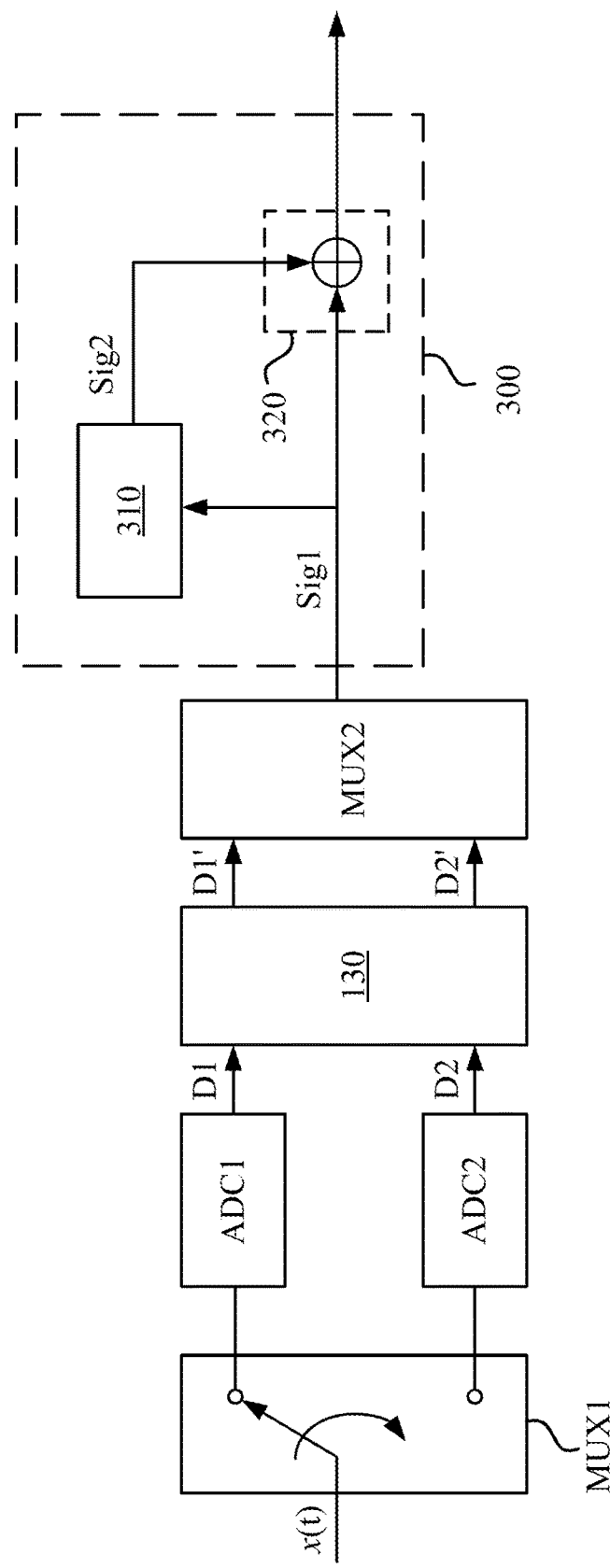
FIG. 3 is a schematic diagram of a calibration circuit according to an embodiment of the present disclosure.

In another embodiments, the filter coefficients $\{a_0, a_1, a_2, a_3, \ldots, a_n\}$ may be changed to omit the frequency shifter 112. Reference is made to FIG. 3. FIG. 3 is a schematic diagram of a calibration circuit 300 according to an embodiment of the present disclosure. The calibration circuit 300 in FIG. 3 includes a filter circuit 310 and a calculating circuit 320. For convenience, a time-interleaved analog-to-digital converter (TI ADC) with two channels is described in the present embodiment. However, the present disclosure is not limited thereto.

The filter circuit 310 may include a signal reconstructed filter. Because the frequency shift by fs/2 can be implemented by multiplying the filter coefficients $\{a_0, a_1, a_2, a_3, \ldots, a_n\}$ by a cyclic sequence $\{+1, -1\}$, the filter circuit 310 can generate the second signal Sig2 by passing the first signal Sig1 through filter coefficients $\{a_0, -a_1, a_2, -a_3, \ldots, a_n\}$, in which the frequency shifter is not required in this embodiment.

The calculating circuit 320 (e.g., an adder) is configured to subtract the second signal Sig2 from the first signal Sig1 to cancel the images 213 and 214 of the interference signals of the first signal Sig1. As shown in FIG. 2D, non-ideal effect at the node D merely has the calibrated interference signals 251 and 252 without the images of the interference signals. Because the calibrated interference signals 251 and 252 are out of the inner band between fs/4 and fs/4, therefore the calibrated interference signals 251 and 252 can be removed by a filter (e.g., a digital filter).

Figure 4:
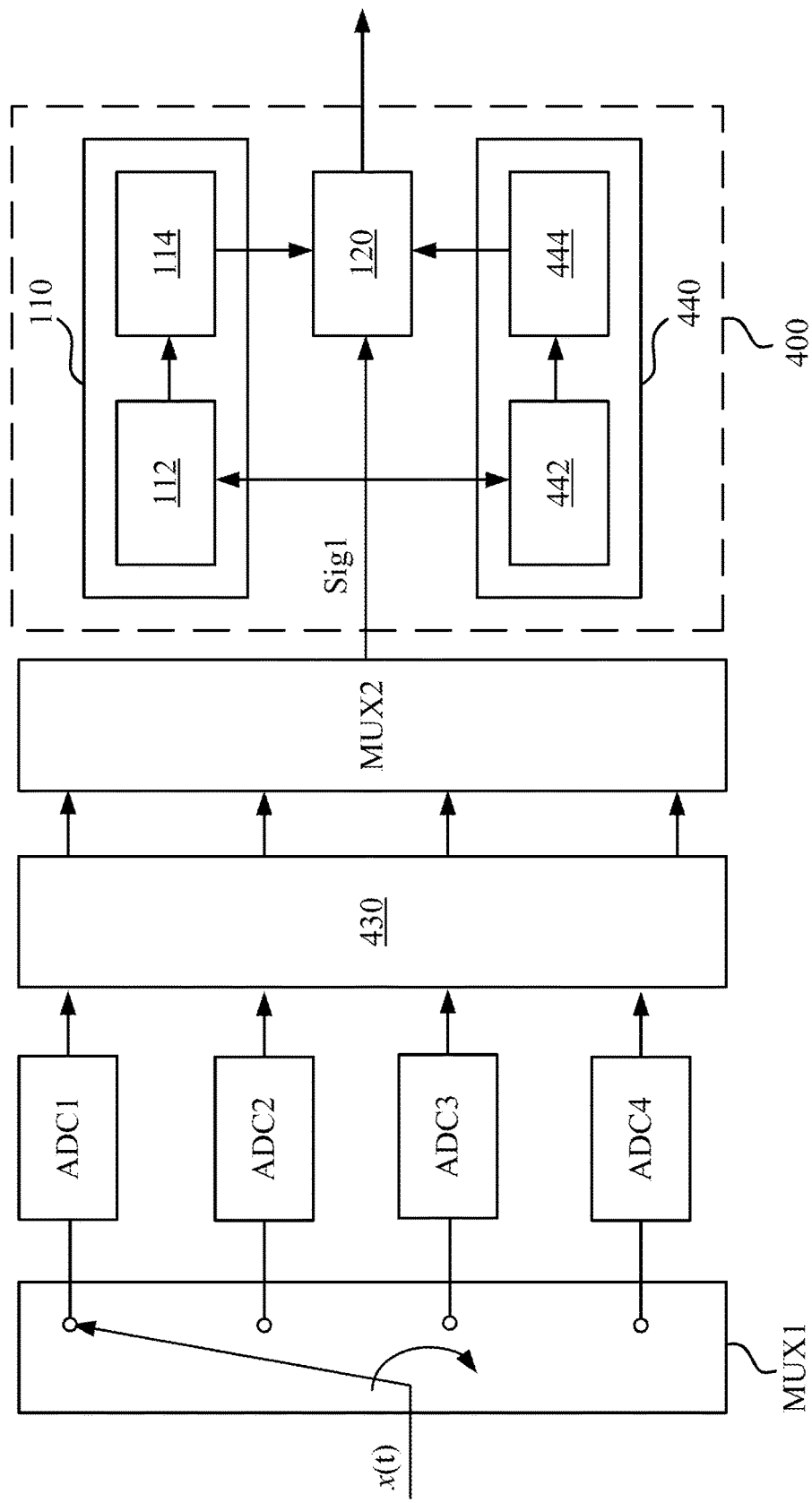
FIG. 4 is a schematic diagram of a calibration circuit according to an embodiment of the present disclosure.

The calibration circuit of the present disclosure is also adaptable to a time-interleaved analog-to-digital converter with different number of channels. For example of an time-interleaved analog-to-digital converter with four channels, as shown in FIG. 4, sampling frequency of every analog-to-digital converters ADC1-ADC4 is fs/4, and therefore sampling frequency of the time-interleaved analog-to-digital converter in FIG. 4 is frequency fs. It should be noted that the first signal Sig1 which has been compensated by the compensation circuit 430 may still have images of interference signals that have frequencies at fin−fs/2, −fin+fs/2, fin−fs/4 and −fin+fs/4. Therefore, compared to the time-interleaved analog-to-digital converter with two channels, the time-interleaved analog-to-digital converter with four channels additionally has the images of the interference signals that have frequencies at fin−fs/4 and −fin+fs/4.

Reference is made to FIG. 4. FIG. 4 is a schematic diagram of a calibration circuit 400 according to an embodiment of the present disclosure. Configuration of the calibration circuit 400 is substantially the same as configuration of the calibration circuit 100, but the calibration circuit 400 further includes a filter circuit 440. Similar to the filter circuit 110, the filter circuit 440 is configured to generate signals based on the first signal Sig1 for canceling images of interference signals with frequencies at fin−fs/4 and −fin+fs/4 of the first signal Sig1.

In an embodiment, the filter circuit 440 includes a frequency shifter 442 and a signal reconstructing filter 444. Similar to the frequency filter 112 and the signal reconstructing filter 114, the frequency filter 442 is configured to shift frequencies of interference signals 211 and 212 of the first signal Sig1 to frequencies of images of the interference signals (not shown) at fin−fs/4 and −fin+fs/4 (i.e., frequency shift being fs/4) to generate shifted interference signals. The signal reconstructing filter 444 is configured to generate reconstructed images of the interference signals according to the images of the interference signals with frequencies at fin−fs/4 and −fin+fs/4 and the shifted interference signals. As aforementioned, amplitudes and phases of the reconstructed images of the interference signals are the same as amplitudes and phases of the images of the interference signals. As a result, the calculating circuit 120 (e.g., a canceler) is configured to cancel the images of the interference signals with frequencies at fin−fs/2, −fin+fs/2, fin−fs/4 and −fin+fs/4 of the first signal Sig1 according to the reconstructed images of the interference signals generated by the filter circuits 110 and 440. Processes of implementing reconstruction based on the first signal Sig1 by the signal reconstructing filter 444 through filter coefficients $\{b_0, b_1, b_2, b_3, \ldots, b_n\}$ and a method of generating the filter coefficients $\{b_0, b_1, b_2, b_3, \ldots, b_n\}$ are similar to the description about the signal reconstructing filter 114, and are not repeated herein.

Figure 5:
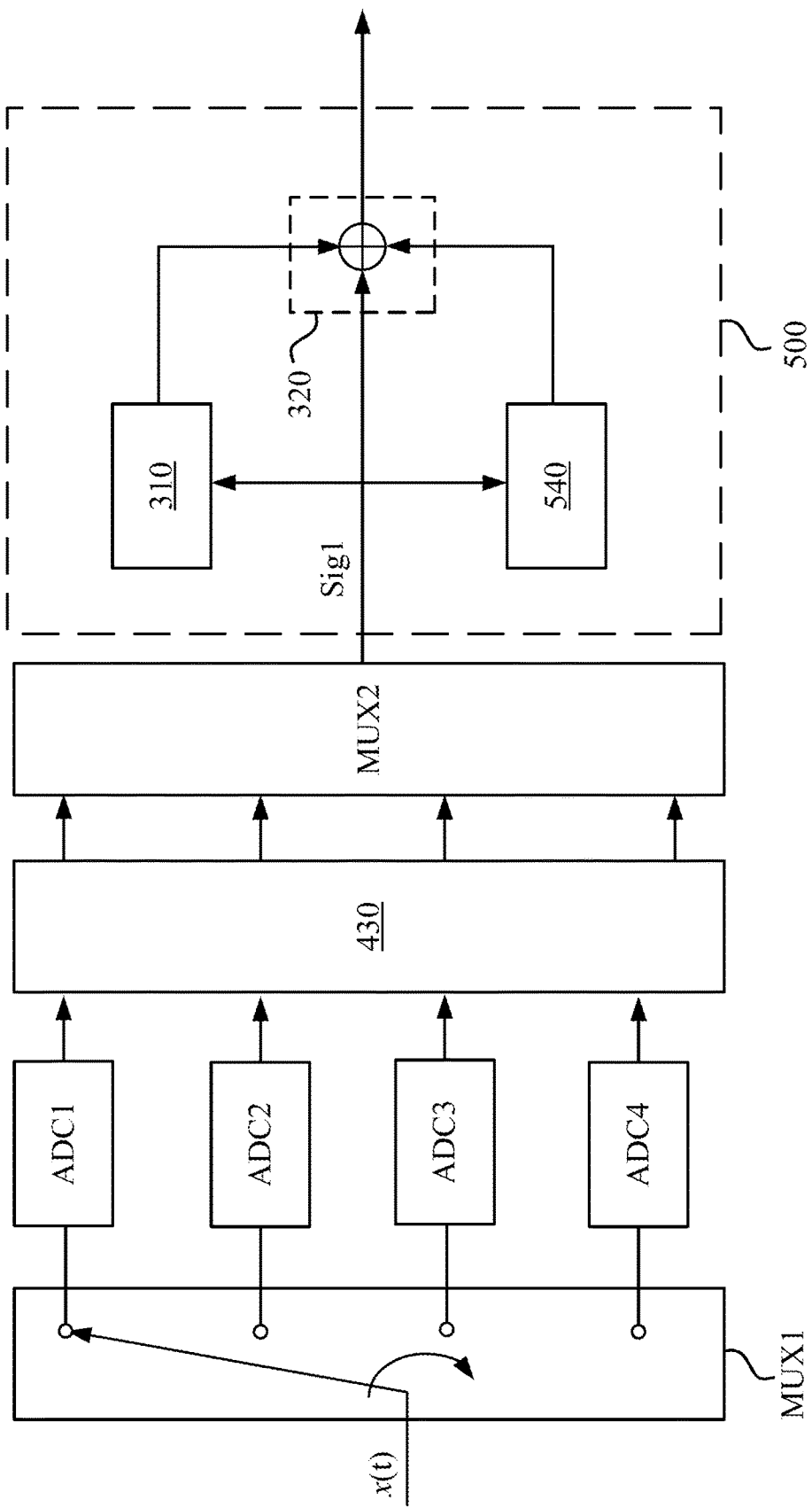
FIG. 5 is a schematic diagram of a calibration circuit according to an embodiment of the present disclosure.

In another embodiment, the filter coefficients $\{b_0, b_1, b_2, b_3, \ldots, b_n\}$ may be changed to omit the frequency shifter 442, and reference is made to FIG. 5. FIG. 5 is a schematic diagram of a calibration circuit 500 according to an embodiment of the present disclosure. Configuration of the calibration circuit 500 is substantially the same as configuration of the calibration circuit 300, except that the calibration circuit 500 further includes a filter circuit 540. For convenience, a time-interleaved analog-to-digital converter with four channels is described in the present disclosure. However, the present disclosure is not limited thereto.

The filter circuit 540 may include a signal reconstructing filter. Because the frequency shift by fs/4 can be implemented by multiplying the filter coefficients $\{b_0, b_1, b_2, b_3, \ldots, b_n\}$ by a cyclic sequence $\{+1, 0, -1, 0\}$, the filter circuit 540 generates the reconstructed images of the interference signal by passing the first signal Sig1 through filter coefficients $\{b_0, 0, -b_2, 0, \ldots, b_n\}$, in which the frequency shifter is not required in this embodiment. As a result, the calculating circuit 320 (e.g., an adder) is configured to add the first signal Sig1 and the reconstructed images of the interference signals generated by the filter circuits 310 and 540 to cancel the images of the interference signals with frequencies at fin−fs/2, −fin+fs/2, fin−fs/4 and −fin+fs/4 of the first signal Sig1.

In practice, the filter circuits 110, 310, 440 and 540, the calculating circuits 120 and 320, the frequency shifters 112 and 442, and the signal reconstructing filters 114 and 444 may be implemented as integrated circuits.

Figure 6:
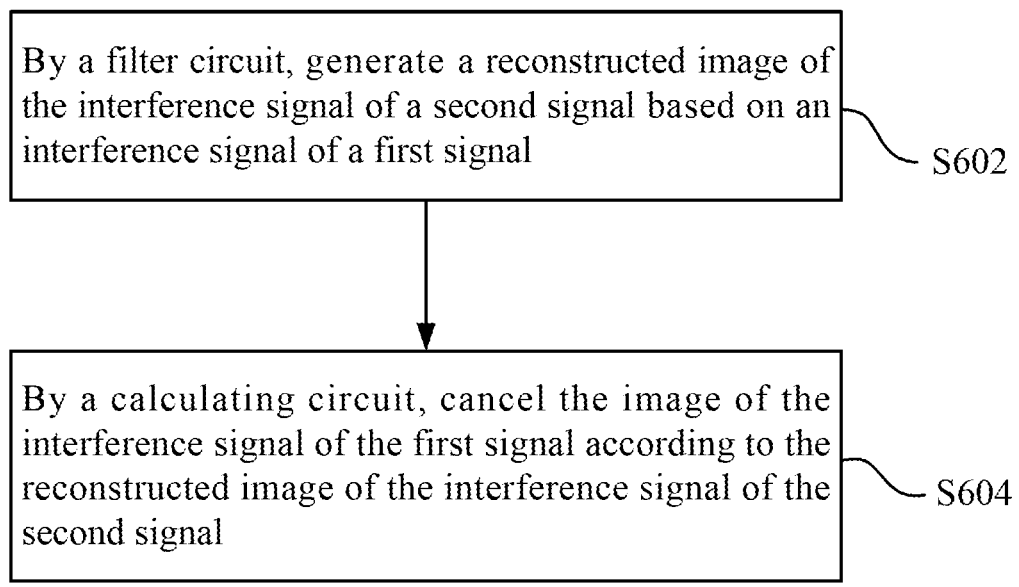
FIG. 6 is a flow chart of a calibration method according to an embodiment of the present disclosure.

FIG. 6 is a flow chart of a calibration method 600 according to an embodiment of the present disclosure. The calibration method 600 includes steps S602-S604, and the calibration method 600 can be applied to the calibration systems 100, 300, 400 and 500 as shown in FIGS. 1, 3, 4 and 5. However, those skilled in the art should understand that the mentioned steps in the present embodiment are in an adjustable execution sequence according to the actual demands except for the steps in a specially described sequence, and even the steps or parts of the steps can be executed simultaneously.

In step S602, by a filter circuit, reconstructed images 231 and 232 of the interference signals of the second signal Sig2 are generated based on interference signals 211 and 212 of a first signal Sig1. As aforementioned, the first signal Sig1 includes the images 213 and 214 of the interference signals, and frequencies of the reconstructed images 231 and 232 of the interference signals are the same as the frequencies of the images 213 and 214 of the interference signals.

In step S604, by the calculating circuit, the images 213 and 214 of the interference signals of the first signal Sig1 are canceled according to the reconstructed images 231 and 232 of the interference signals of the second signal Sig2.

In conclusion, the calibration circuit and the calibration method that can cancel the images of the interference signals are provided in the present disclosure. The calibration circuit and the calibration method provided in the present disclosure can effectively cancel the images of the interference signals resulted from channel mismatch of the time-interleaved analog-to-digital converter, and therefore distortion problem of the sampled data is solved and performance of the time-interleaved analog-to-digital converter is improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims.

What is claimed is:

1. A calibration circuit for a time-interleaved analog-to-digital converter (TI ADC), wherein the calibration circuit comprises:
    a filter circuit configured to receive a first signal and generate a second signal based on the first signal, wherein the first signal comprises an image of an interference signal, the second signal comprises a reconstructed image of the interference signal, and a frequency of the reconstructed image of the interference signal is the same as a frequency of the image of the interference signal; and
    a calculating circuit configured to cancel the image of the interference signal of the first signal according to the second signal.

2. The calibration circuit of claim 1, wherein the filter circuit is further configured to generate the second signal by passing the first signal through filter coefficients, and the calculating circuit is further configured to add the first signal and the second signal to cancel the image of the interference signal of the first signal.

3. The calibration circuit of claim 2, wherein frequency shift and fast Fourier transform (FFT) are performed to a plurality of test signals to generate a plurality of first intermediate signal, FFT is performed to the test signals to generate a plurality of second intermediate signal, and the filter coefficients are generated through dividing the first intermediate signals by the second intermediate signals and performing inverse fast Fourier transform (IFFT).

4. The calibration circuit of claim 2, wherein the calculating circuit is an adder.

5. The calibration circuit of claim 1, wherein the first signal comprises an interference signal, the filter circuit is further configured to shift a frequency of the interference signal to a frequency of the image of the interference signal to generate a shifted interference signal, and generate the second signal according to the image of the interference signal and the shifted interference signal.

6. The calibration circuit of claim 5, wherein the filter circuit is further configured to shift a frequency of the first signal according to a sampling frequency of the time-interleaved analog-to-digital converter to generate the shifted interference signal.

7. The calibration circuit of claim 5, wherein the filter circuit is further configured to adjust an amplitude and a phase of the shifted interference signal to an amplitude and a phase of the image of the interference signal to generate the second signal.

8. The calibration circuit of claim 5, wherein the filter circuit comprises:
    a frequency shifter configured to shift the frequency of the interference signal to the frequency of the image of the interference signal to generate the shifted interference signal; and
    a signal reconstructing filter configured to generate the second signal according to the image of the interference signal and the shifted interference signal.

9. The calibration circuit of claim 5, wherein the calculating circuit is further configured to subtract the second signal from the first signal to cancel the image of the interference signal of the first signal.

10. The calibration circuit of claim 9, wherein the calculating circuit is a canceler.

11. A calibration method for a time-interleaved analog-to-digital converter, wherein the calibration method comprises:
    by a filter circuit, generating a reconstructed image of the interference signal of a second signal based on an interference signal of a first signal, wherein the first signal comprises an image of the interference signal, and a frequency of the reconstructed image of the interference signal is the same as a frequency of the image of the interference signal; and
    by a calculating circuit, canceling the image of the interference signal of the first signal according to the reconstructed image of the interference signal of the second signal.

12. The calibration method of claim 11, further comprising:
    by the filter circuit, generating the reconstructed image of the interference signal of the second signal by passing the interference signal of the first signal through filter coefficients; and
    by the calculating circuit, adding the image of the interference signal of the first signal and the reconstructed image of the interference signal of the second signal to cancel the image of the interference signal of the first signal.

13. The calibration method of claim 12, further comprises:
    performing frequency shift and fast Fourier transform (FFT) to a plurality of test signals to generate a plurality of first intermediate signal;
    performing FFT to the test signals to generate a plurality of second intermediate signal; and
    generating the filter coefficients through dividing the first intermediate signals by the second intermediate signals and performing inverse fast Fourier transform (IFFT).

14. The calibration method of claim 12, wherein the calculating circuit is an adder.

15. The calibration method of claim 11, further comprising:
    by the filter circuit, shifting a frequency of the interference signal to a frequency of the image of the interference signal to generate a shifted interference signal, and generating the second signal according to the image of the interference signal and the shifted interference signal.

16. The calibration method of claim 15, further comprising:
    by the filter circuit, shifting a frequency of the interference signal of the first signal according to a sampling frequency of the time-interleaved analog-to-digital converter to generate the shifted interference signal.

17. The calibration method of claim 15, further comprising:
    by the filter circuit, adjusting an amplitude and a phase of the shifted interference signal to an amplitude and a phase of the image of the interference signal to generate the second signal.

18. The calibration method of claim 15, wherein the filter circuit comprises a frequency shifter and a signal reconstructing filter, and the calibration method further comprises:

by the frequency shifter, shifting the frequency of the interference signal to the frequency of the image of the interference signal to generate the shifted interference signal; and by the signal reconstructing filter, generating the second signal according to the image of the interference signal and the shifted interference signal.

19. The calibration method of claim 15, further comprising:

by the calculating circuit, subtracting the reconstructed image of the interference signal of the second signal from the image of the interference signal of the first signal to cancel the image of the interference signal of the first signal.

20. The calibration method of claim 19, wherein the calculating circuit is a canceler.

* * * * *